United States Patent
Martinson et al.

(10) Patent No.: US 9,512,516 B1
(45) Date of Patent: Dec. 6, 2016

(54) COOLING WATER JET PACK FOR HIGH POWER ROTARY CATHODES

(75) Inventors: Robert Martinson, Palo Alto, CA (US); Paul Shufflebotham, San Jose, CA (US); Kevin Lynch, Santa Clara, CA (US); Heinrich von Bunau, San Jose, CA (US); Deborah Sloan, San Ramon, CA (US); Daniel R. Juliano, Santa Clara, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 793 days.

(21) Appl. No.: 12/888,963

(22) Filed: Sep. 23, 2010

Related U.S. Application Data

(60) Provisional application No. 61/397,712, filed on Sep. 24, 2009.

(51) Int. Cl.
*C23C 14/34* (2006.01)
*H01J 37/34* (2006.01)

(52) U.S. Cl.
CPC ....... *C23C 14/3407* (2013.01); *H01J 37/3405* (2013.01); *H01J 37/3497* (2013.01)

(58) Field of Classification Search
CPC  H01J 37/3497; H01J 37/3405; C23C 14/3407
USPC ...... 204/298.09, 298.21, 298.22; 165/104.19
See application file for complete search history.

(56) References Cited

U.S. PATENT DOCUMENTS

| | | | | |
|---|---|---|---|---|
| 3,962,473 A | * | 6/1976 | Lilov | ............................ 426/282 |
| 5,262,032 A | * | 11/1993 | Hartig et al. ............ | 204/298.21 |
| 5,569,361 A | * | 10/1996 | Hurwitt | .................... 204/192.12 |
| 5,985,115 A | * | 11/1999 | Hartsough et al. ...... | 204/298.09 |
| 6,641,701 B1 | | 11/2003 | Tepman | |
| 7,087,145 B1 | | 8/2006 | Choquette et al. | |
| 7,504,011 B2 | | 3/2009 | Schmidt et al. | |
| 2002/0100680 A1 | * | 8/2002 | Yamamoto et al. ..... | 204/192.12 |
| 2005/0109392 A1 | | 5/2005 | Hollars et al. | |
| 2005/0178662 A1 | * | 8/2005 | Wurczinger ............. | 204/298.21 |
| 2005/0236270 A1 | * | 10/2005 | Cheng et al. ............ | 204/298.09 |
| 2007/0089982 A1 | | 4/2007 | Richert et al. | |
| 2007/0089985 A1 | | 4/2007 | Schmidt et al. | |
| 2007/0089986 A1 | * | 4/2007 | Richert et al. ........... | 204/298.12 |

(Continued)

FOREIGN PATENT DOCUMENTS

WO  WO 2009/138348   * 11/2009

OTHER PUBLICATIONS

Acute angle. (n.d.) The American Heritage® Dictionary of the English Language, Fourth Edition. (2003). Retrieved Jun. 26, 2013 from http://www.thefreedictionary.com/acute+angle.*

(Continued)

*Primary Examiner* — John Brayton
(74) *Attorney, Agent, or Firm* — The Marbury Law Group PLLC

(57) ABSTRACT

A sputtering target assembly, including a cylindrical backing tube, a magnet assembly disposed within the backing tube, and a conduit disposed within the backing tube and adapted for transporting coolant. The conduit includes at least one first opening positioned for providing the coolant in a substantially circumferential direction from the conduit toward an inner surface of the backing tube into a gap volume between a front side of the magnet assembly and the inner surface of the backing tube.

15 Claims, 12 Drawing Sheets

(56) References Cited

U.S. PATENT DOCUMENTS

2008/0105542 A1* 5/2008 Purdy et al. ............. 204/298.13
2008/0110491 A1* 5/2008 Buller et al. ................. 136/249
2011/0062022 A1* 3/2011 Goderis et al. .......... 204/298.12

OTHER PUBLICATIONS

Bekaert web page, End Blocks product description, 2003, 2 pages.
Bekaert web page, Flextrak Magnet Bar product description, 2003, 3 pages.

* cited by examiner

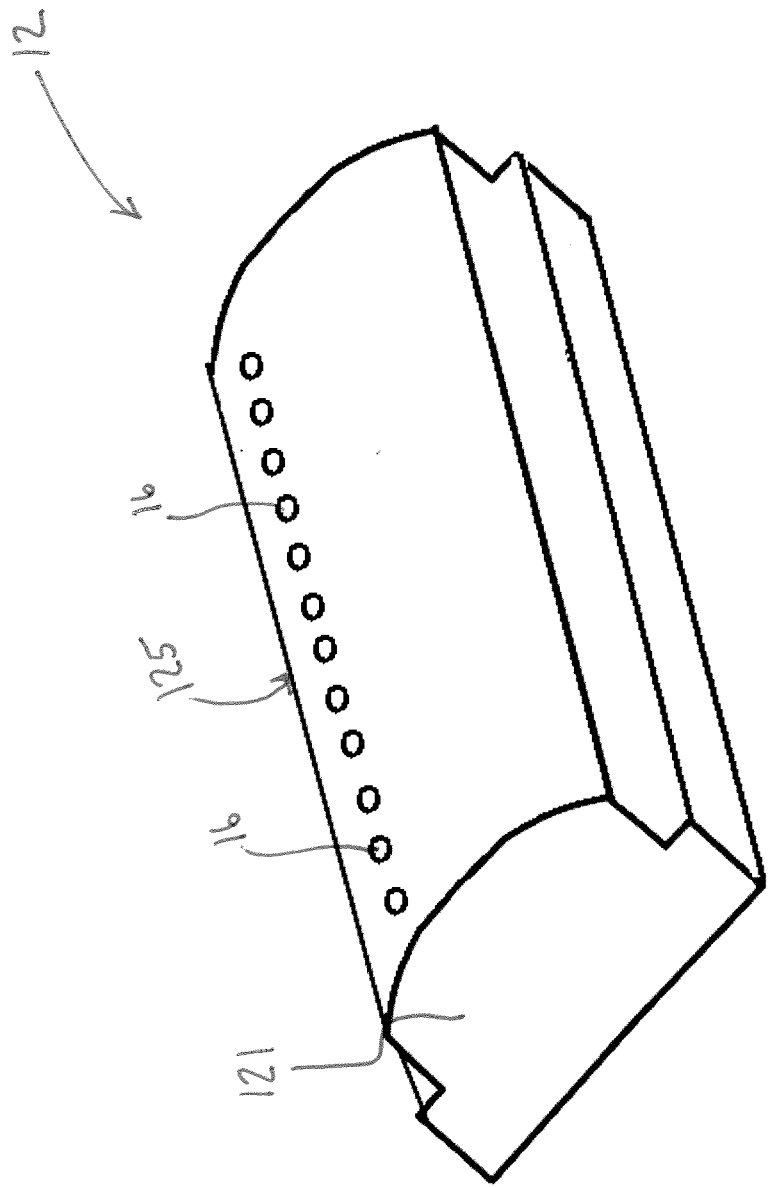

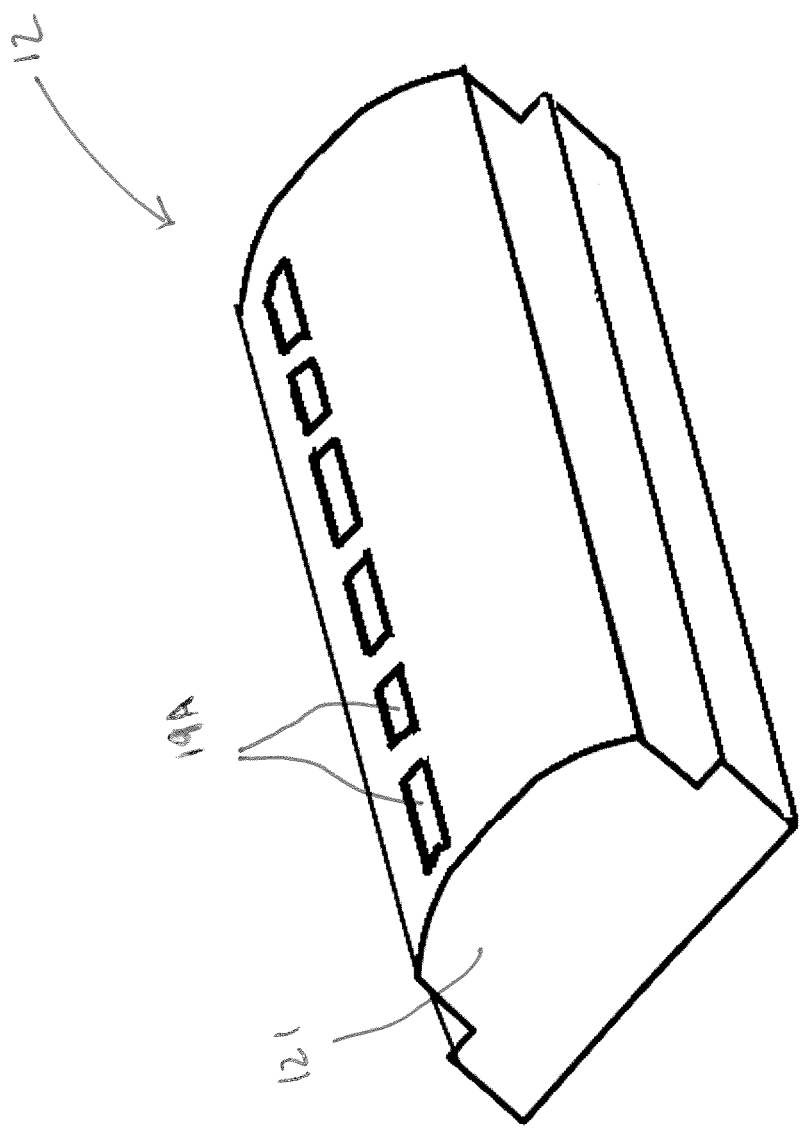

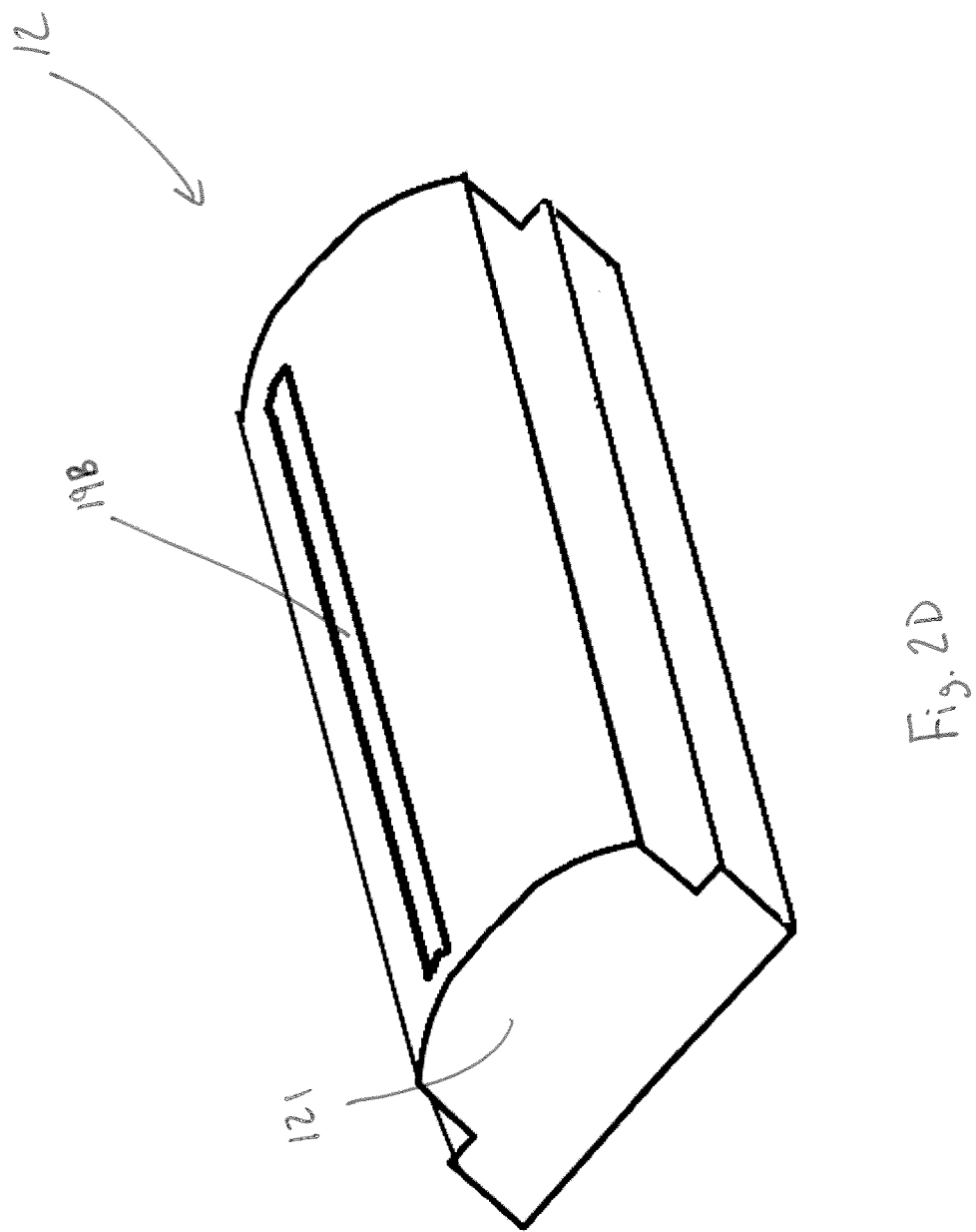

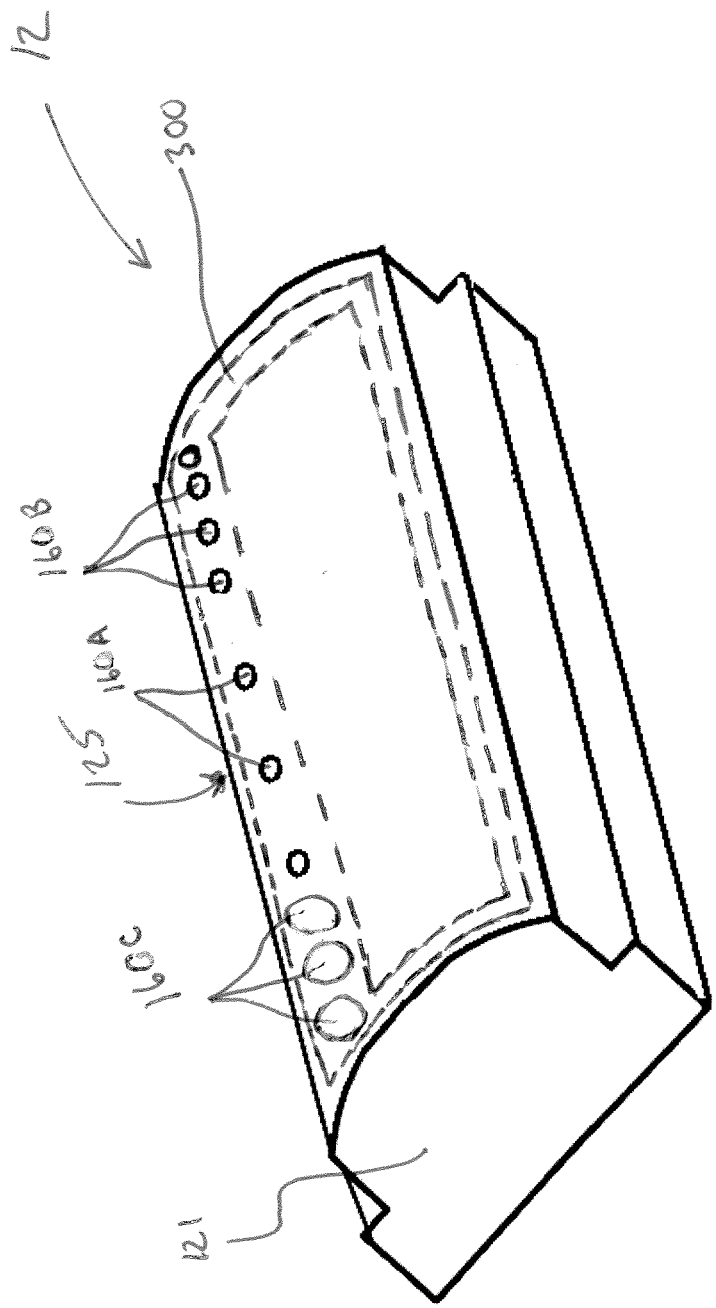

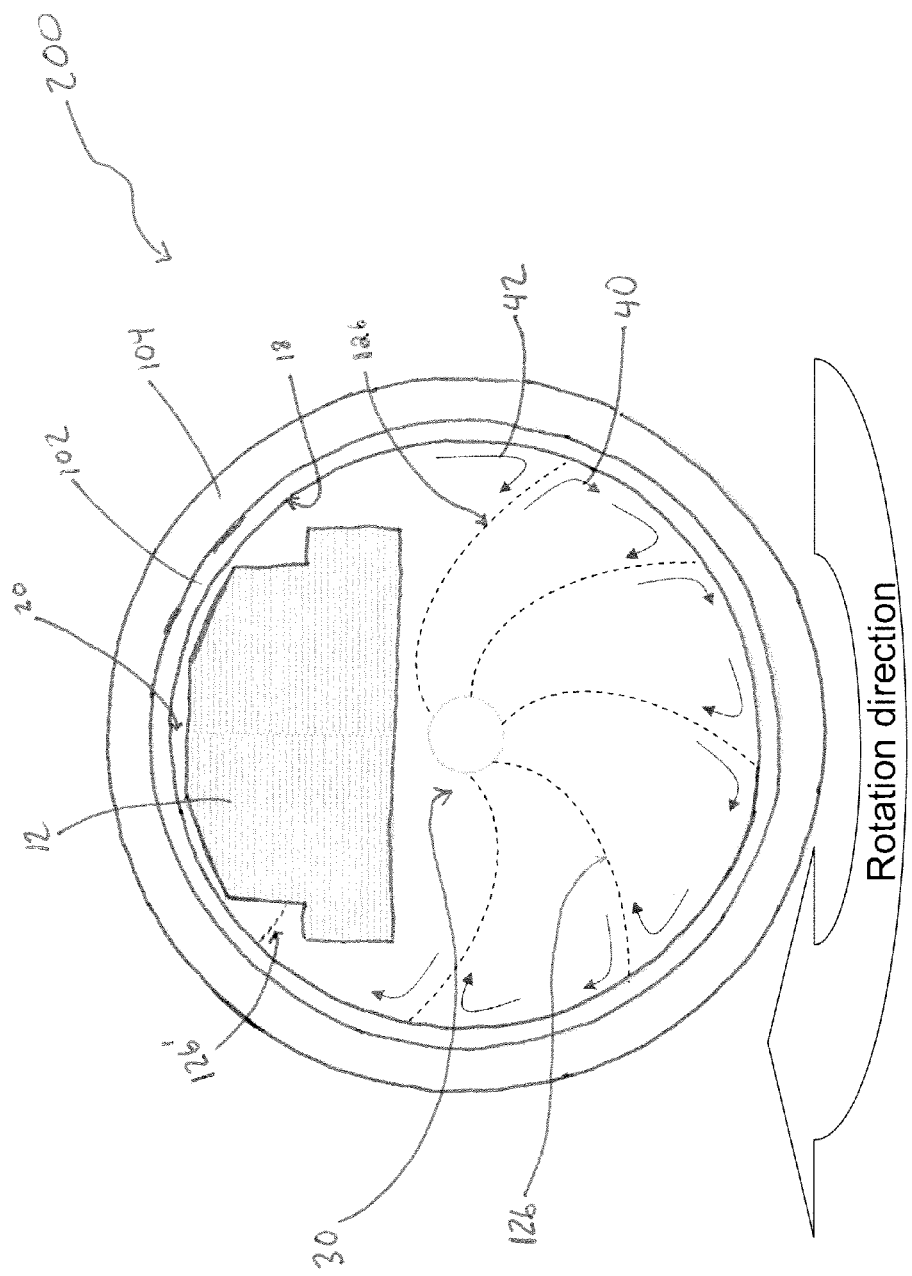

COOLING WATER JET PACK FOR HIGH POWER ROTARY CATHODES

BACKGROUND OF THE INVENTION

The invention relates generally to sputtering targets and specifically to target cooling methods.

During sputtering, some cylindrical sputtering targets, also known as rotary cathodes, rely on coolant to remove excess heat. The heat input profile is determined by the shape and strength of the magnets combined with magnitude which is determined by the sputter energy provided by the sputter power supply.

Conventionally, coolant flow proceeds in an axial direction with water entering through one end of the target, and exiting at an opposite end. In U.S. Pat. No. 7,504,011 (Schmidt et al.), incorporated herein by reference in its entirety, coolant enters at a first end of the target, reverses direction near a second end, and exits again through the first end. Often, water serves as the coolant material to remove approximately 90-95% of the unwanted heat.

One problem associated with the conventional target configurations and methods for cooling targets is that water may stagnate due to tight clearances between the cathode magnets (also called a magnet assembly) and the inner diameter of the target backing tube. This reduces the heat transfer coefficient and may lead to non-uniform temperature distribution along the length of the target, with higher temperatures at the top than at the bottom, and generally higher than allowable temperatures on the target surface.

SUMMARY OF THE EMBODIMENTS

One embodiment of the invention provides a sputtering target assembly, including a cylindrical backing tube, a magnet assembly disposed within the backing tube, and a conduit disposed within the backing tube and adapted for transporting coolant. The conduit comprises at least one first opening positioned for providing the coolant in a substantially circumferential direction from the conduit toward an inner surface of the backing tube into a gap volume between a front side of the magnet assembly and the inner surface of the backing tube.

Another embodiment of the invention provides a sputtering target assembly, including a cylindrical backing tube, a magnet assembly disposed within the backing tube, a conduit disposed within the backing tube and adapted for transporting coolant, and at least one wiper fin disposed within the backing tube, wherein the at least one wiper fin contacts an inner surface of the backing tube while the backing tube rotates past the at least one wiper fin to agitate a coolant boundary layer located along the inner surface of the backing tube.

Another embodiment of the invention provides a sputtering target assembly, including a cylindrical backing tube, a magnet assembly disposed within the backing tube, and a means for providing a coolant in a substantially circumferential direction toward an inner surface of the backing tube and into a gap volume between a front side of the magnet assembly and the inner surface of the backing tube.

Another embodiment of the invention provides a method for cooling a sputtering target assembly, including providing a sputtering target assembly comprising, a cylindrical backing tube, a magnet assembly disposed within the backing tube, and a conduit disposed within the backing tube. This embodiment further provides the steps of flowing a coolant from the conduit in a substantially circumferential direction toward an inner surface of the backing tube and into a gap volume between a front side of the magnet assembly and the inner surface of the backing tube.

BRIEF DESCRIPTION OF THE DRAWINGS

FIG. 2A is a perspective view of an embodiment of the magnet assembly of FIG. 1A.

FIG. 2C is a perspective view of another embodiment of the magnet assembly of FIG. 1A.

FIG. 2D is a perspective view of another embodiment of the magnet assembly of FIG. 1A.

FIG. 2E is a perspective view of another embodiment of the magnet assembly of FIG. 1A.

FIG. 3 is a top cross-sectional view of the sputtering target assembly of another embodiment.

DETAILED DESCRIPTION OF THE EMBODIMENTS

Figure 1A:
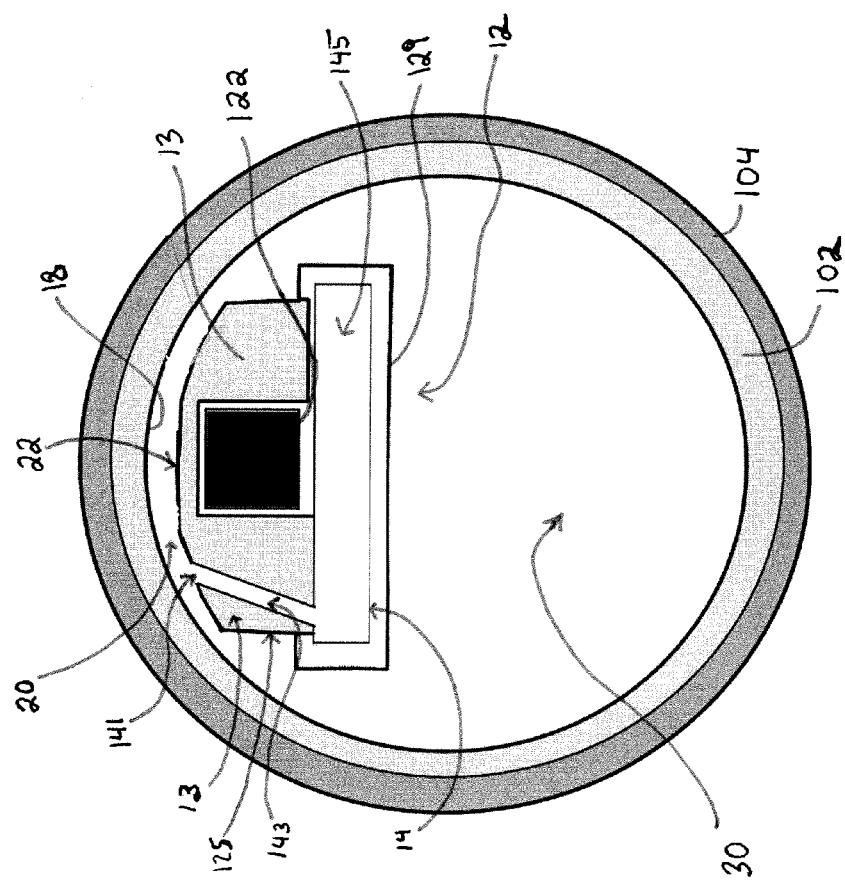
FIG. 1A is a top cross-sectional view of a sputtering target assembly of one of the embodiments.

An exemplary sputtering technique is magnetron sputtering, which utilizes magnetrons to excite electrons and ionized gas atoms to cause the material of a sputtering target to be deposited onto a substrate. Examples of such magnetron sputtering techniques, such as AC or DC planar or rotary magnetron sputtering are discussed in U.S. application Ser. No. 10/973,714, filed on Oct. 25, 2004, which is hereby incorporated by reference in its entirety.

Rotary magnetron sputtering uses cylindrical sputtering targets that include a cylindrical backing tube on which the target material is formed, and at least one magnet located as part of a magnet assembly. The magnet assembly is disposed inside the backing tube. Ideally, due to the continuous displacement of the magnetic flux lines (commonly known as the "racetrack") running through the backing tube wall as the tube is rotated around magnets of the magnet assembly, uniform erosion is achieved at the surface of the backing tube of the sputtering target assembly. Such an erosion profile results in higher utilization of the target material in comparison to the erosion profiles provided by other sputtering techniques, such as stationary, planar magnetron sputtering techniques. High power operation of sputtering systems requires more thermal energy to be transmitted away from the target material and backing tube. Furthermore, all sections of the target material will be exposed to the magnetic racetrack, where electrically charged particles are trapped by strong magnetic fields, as the target rotates. Additionally, non-uniform temperature profiles across such targets due to non-uniform heat exchange may cause damage of the sputtering materials.

The sputtering target and methods of the present embodiments provide an enhancement of the heat transfer coefficient by providing high circumferential flow, especially toward a gap volume between cathode magnets (i.e., the magnet assembly) and the backing tube of a sputtering target. By providing at least one opening at a side of a magnet assembly, coolant flow may be provided in a substantially circumferential direction. The openings may be provided adjacent to one another, or side-by-side, from substantially one end of a magnet assembly to the other. In other words, the openings may be aligned substantially along the length (i.e., along the length of the axis) of the magnet assembly. In one embodiment, by providing a constant circumferential velocity profile of the coolant flow provided by a plurality of openings along the direction of the axis, uniform heat removal in the axial dimension may be achieved, thus resulting in a uniform temperature profile at the target. In other words, the circumferential velocity of the coolant flow is the same at the top, middle and bottom of the magnet assembly. In another embodiment described below with respect to FIG. 2E, higher densities of openings are provided at top and bottom portions of the magnet assembly to provide increased coolant flow at these locations, thereby compensating for non-uniform heat input to the target. It is noted that the terms top and bottom are relative terms, and as used herein are applied to describe portions of elements for both vertical and horizontal sputtering target orientations.

Dimensions of the at least one opening, and/or surface treatments of surrounding surfaces such as those of the inner wall of the backing tube and/or magnet assembly, may be provided such that the substantially circumferential coolant flow is maintained at such velocities to increase the Reynolds number. The Reynolds number may be increased by such dimensions and/or treatments so as to induce turbulent flow of the coolant from the at least one opening. The coolant may then be directed or provided to a gap volume between a front side of the magnet assembly and inner surface of the backing tube in turbulent flow. However, a mixture of turbulent and laminar coolant flow, or just laminar coolant flow may be used instead.

Preferably, the coolant entering the backing tube of the target is forced to route through a conduit disposed within the magnet assembly, and provided through at least one opening from the conduit and in a substantially circumferential direction from to a gap volume. The coolant then flows and may fill a remaining volume within the backing tube surround the magnet assembly and may then exit the backing tube.

In the following description, similar components have been labeled similarly across all figures.

Figure 1B:
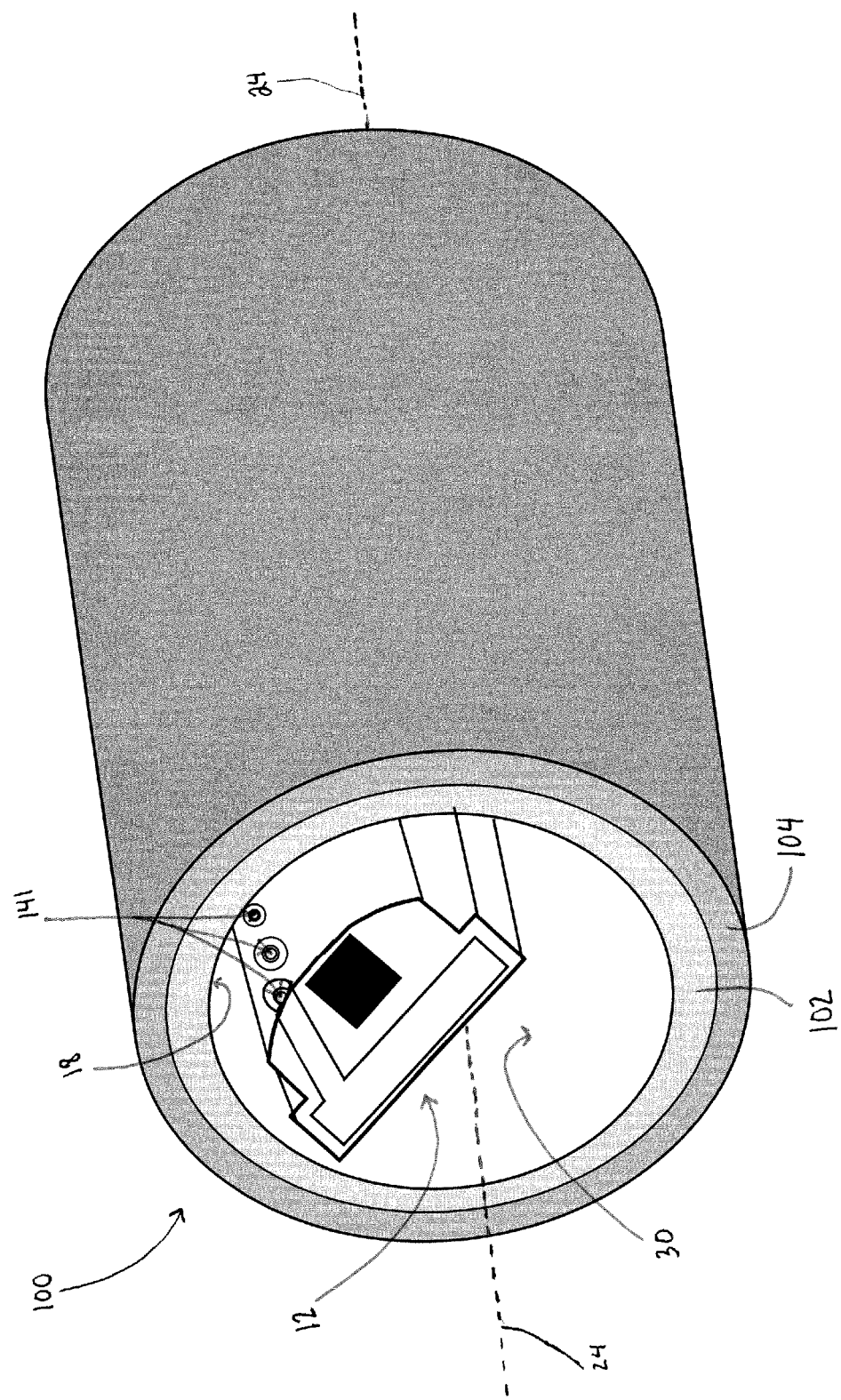
FIG. 1B is a perspective view of a portion of the sputtering target assembly of FIG. 1A.
Figure 1C:
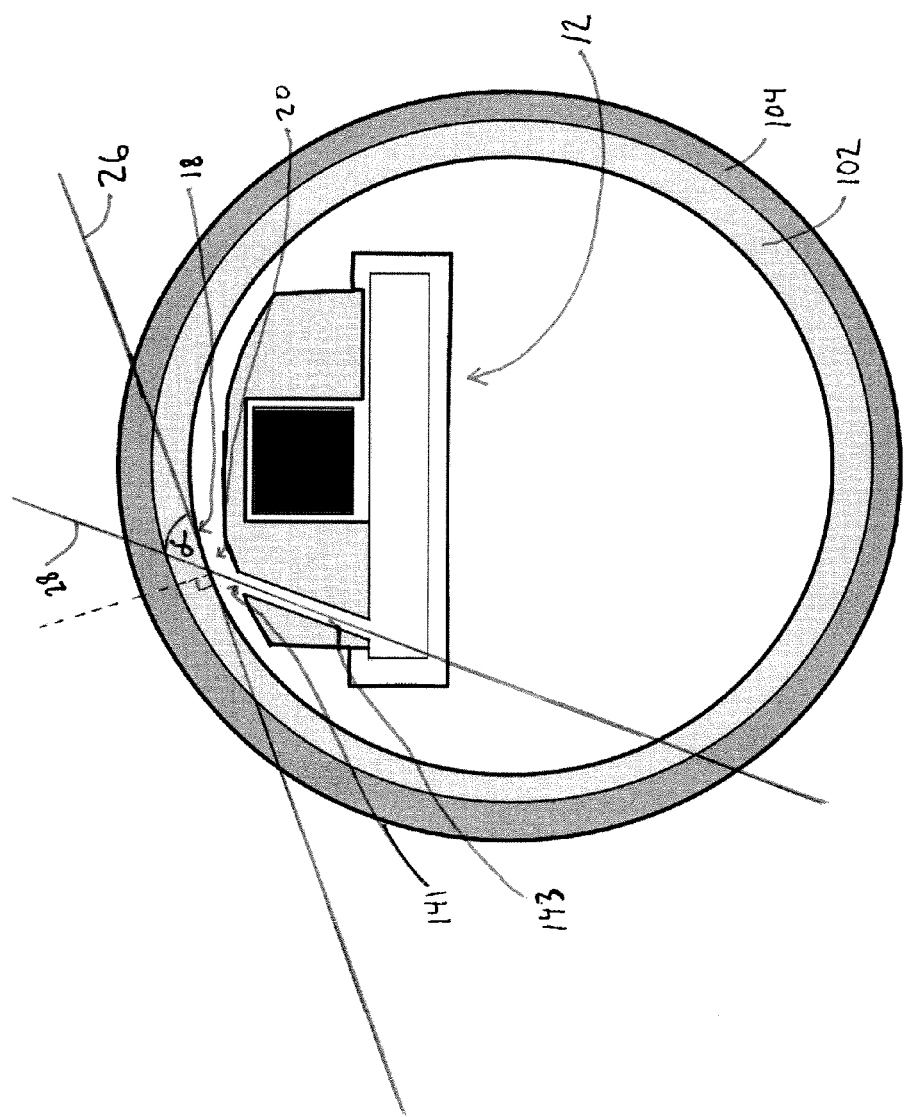
FIG. 1C shows a top cross sectional view of the geometrical configuration of a sputtering target of the present embodiments.

Referring to FIGS. 1A-1C, one embodiment of the invention provides a sputtering target assembly 100, including a cylindrical backing tube 102, a magnet assembly 12 disposed within the backing tube 102, and a conduit 14 disposed within the backing tube 102 and adapted for transporting coolant. The conduit 14 may comprise at least one first opening 141 positioned for providing the coolant in a substantially circumferential direction from the conduit 14 toward an inner surface 18 of the backing tube into a gap volume 20 between a front side 22 of the magnet assembly and the inner surface 18 of the backing tube. The at least one first opening 141 is located adjacent to a side portion 125 of the magnet assembly 12. Cover plate 13 may comprise the front side 22 of the magnet assembly 12 housing. Plate 13 protects the magnets 122 from contacting the coolant. Upon coolant being introduced into the gap volume 20, the coolant then flows into an interior backing tube volume 30 that at least partially surrounds the magnet assembly 12. Additionally, a sputtering material may be formed on an outside diameter of the backing tube to form a sputtering material layer 104. In one embodiment, the sputtering material layer may comprise a copper indium gallium sputtering material located on an outer surface of the backing tube, but may include other sputterable materials.

The conduit 14 comprises a coolant channel 143 fluidly connected to a coolant plenum 145. In other words, the coolant plenum 145, the coolant channel 143 and the gap volume 20 form a coolant circuit. The coolant channel 143 is located adjacent to the side portion 125 of the magnet assembly 12, and the coolant plenum 145 is disposed within the backing tube 102, adjacent to a back portion 129 of the magnet assembly. The coolant plenum can comprise at least one baffle and/or a partition adapted to direct flow of coolant in a substantially circumferential direction. For example, the coolant channel may be embedded in a side portion of the cover plate 13 of the magnet assembly 12. The cover plate may comprise any suitable non-magnetic material, such as aluminum, brass, plastic, etc., or another material that does not substantially interfere with the magnetic flux provided by the magnets as necessary for sputtering. The magnet assembly housing may also partially form the wall(s) of plenum 145. For example, the back portion 129 of the housing forms the back wall of the plenum 145, and the backing plates of the magnet form a front wall of the plenum. Additionally, the cover plate 13 and/or the inner surface 18 of the backing tube 102 can be roughened or patterned to induce turbulent flow of the coolant, disrupt the laminar flow of the coolant and improve heat transfer.

As shown in the perspective cross sectional view of target 100 in FIG. 1B, the magnet assembly 12 extends substantially parallel to a longitudinal axis 24 of the cylindrical backing tube 102. Furthermore, referring briefly to FIG. 2A, the magnet assembly 12 comprises a first end 121, a second end (not visible), and a side portion 125 extending between the first and second end.

Referring back to FIGS. 1A-1C, the coolant plenum 145 can be adapted to stiffen the magnet assembly. This helps to prevent bowing and warping of backing plates within the magnet assembly and therefore prevents distortion of the magnetic field that controls the plasma during sputtering. Also, the coolant plenum 145 can contain an inlet located at a first end of the backing tube that can be fluidly connected to a coolant inlet or coolant source (not shown) at a first end of the magnet assembly 12, such as the bottom end of a vertical assembly 12. Thus, the coolant plenum can be fluidly connected to a coolant source (not shown), for example an external coolant source, such as a water coolant source (i.e., water pipe). An outlet (not shown) may be located at the second end, such as the top end, of the backing tube 102 and may be formed opposite to the first end. The outlet may be adapted to allow the water coolant to exit from within the backing tube and target assembly. Baffles and/or partitions may also be formed at first and second ends of the coolant plenum to block axial flow at the first and second ends of the coolant plenum. The baffles and/or partitions formed at the first and second ends of the coolant plenum may be formed as portions of the cover plate 13.

As shown in FIG. 1C, the at least one first opening 141 of the sputtering target assembly 100 may face the inner surface 18 of the backing tube 102 at an angle α with respect to line 26. Preferably the angle is 45° or less, such as 5-40°, such as 5-35°. As shown in the figure, line 26 runs tangential to a point opposite opening 141 on the inner surface 18 of the backing tube. Angle α may be defined as the angle between line 26 and line 28, where line 28 runs through the center of channel 143. While the at least one first opening 141 may be formed so as to face the inner surface 18 of the backing tube at such an angle as described above, the embodiments are not so limited. Irrespective of the position or configuration of the openings 141, coolant is preferably provided at an initial angle α with respect to line 26. The embodiment provided in FIG. 1C and described above is only presented as one example in which the at least one first opening is formed for providing the coolant in a substantially circumferential direction. Many other alternatives are known in the art of fluid dynamics and fluid transport for providing fluid or coolant, in such a manner as described above.

In one embodiment, the term "substantially circumferential" means that the coolant is provided into the gap volume along a majority of the axis of the backing tube. For example, the coolant may be injected from multiple openings formed along the length of magnet assembly, or from one slit that extends substantially an entire length of the magnet assembly (as will be described in more detail below with respect to FIG. 2D). The coolant is forced to flow in the substantially circumferential direction when the coolant is injected along a majority of the axis (e.g., along at least 50% of the axis, such as 75-100%) rather than from a single discreet point on the axis. In another embodiment, the term "substantially circumferential" means that coolant is provided toward the inner surface of the backing tube and into the gap volume at angle of α where α may be 45° or less, such as 5-40°, and such as 5-35°, with respect to a line tangential to the inner surface of the backing tube enclosing the gap volume as described for the embodiment of FIG. 1C above. Preferably, the coolant is provided in a direction that is substantially perpendicular to axis 24 in FIG. 1B. For example, the direction of the majority of the coolant flow is provided in a direction that deviates by 0-20 degrees, such as 1-10 degrees from a direction perpendicular to axis 24. In another embodiment, the term "substantially circumferential" means both that the coolant is provided into the gap volume along a majority of the axis of the backing tube and that the angle α is 45° or less. However, it should be noted that the angle α does not have to be 45° or less to achieve circumferential flow. For example, while the at least one opening 141 is shown as being located near the edge of the magnet assembly, the at least one opening may be located in the middle of the magnet assembly. In this case, the angle α may be greater than 45°, such as 46 to 90° and when the coolant is provided into the gap volume along a majority of the axis of the backing tube, it would flow in at least one substantially circumferential direction (e.g., in the clockwise and/or counterclockwise direction when viewed from one end of the backing tube). In another embodiment, the term "substantially circumferential" means that that the coolant is provided into the gap volume in a substantially circumferential direction because the only substantial fluidic connection between a coolant inlet and outlet is the gap volume between a front side of the magnet assembly and an inner surface of the backing tube.

Figure 2B:
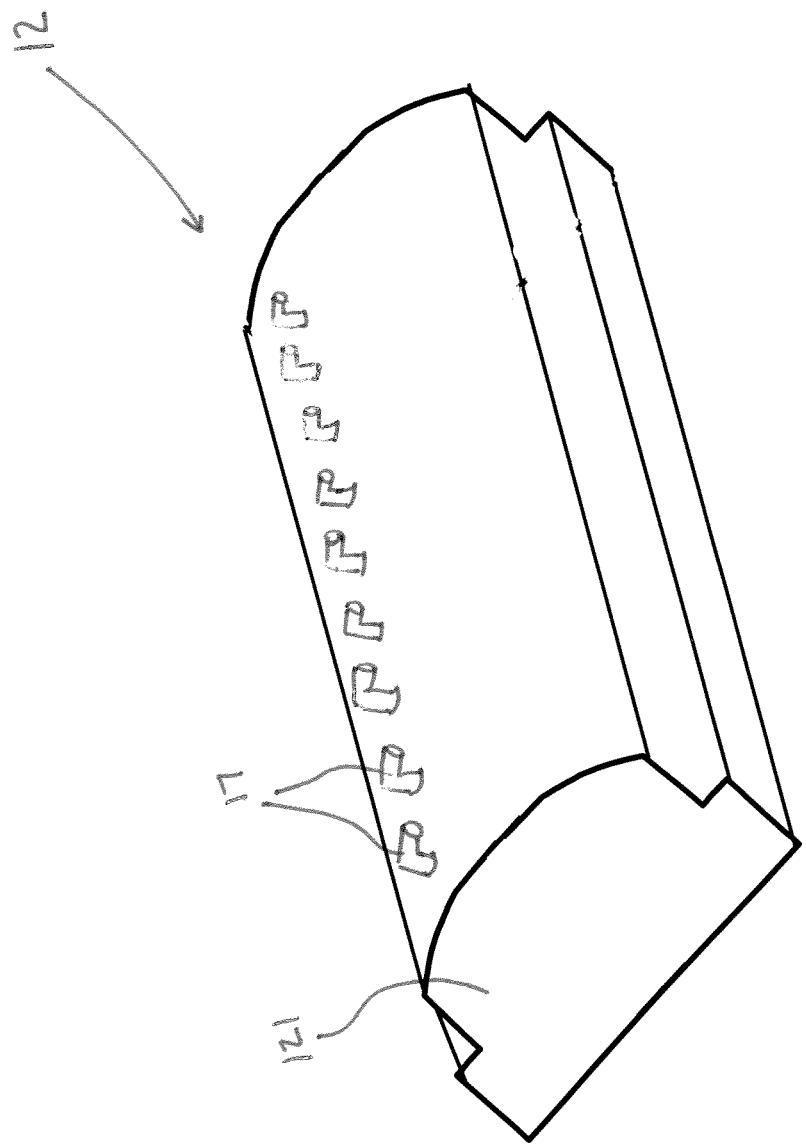
FIG. 2B is a perspective view of another embodiment of the magnet assembly of FIG. 1A.

For example, as shown in FIGS. 2A-2C, the at least one first opening 141 can be formed as a plurality of aperture openings 16, a plurality of nozzles 17, and/or a plurality of small slits 19a, wherein these openings can be directed at the inner surface 18 of the backing tube 102 as shown in FIGS. 1A-1C and/or formed to provide coolant in a substantially circumferential direction. Alternatively, as shown in FIG. 2D, the at least one first opening 141 can be formed as one slit 19B that extends substantially an entire length of the magnet assembly, and facing the inner surface of the backing tube. As discussed above, the at least one first opening 141, whether an aperture openings, nozzles, or slits, is formed to provide coolant flow in a substantially circumferential direction. Thus, in an embodiment of the target assembly, a means for providing a coolant in a substantially circumferential direction toward an inner surface of the backing tube 102 and into the gap volume 20 between a front side of the magnet assembly and the inner surface of the backing tube may be at least one aperture, at least one nozzle, at least one small slit, or a slit extending substantially an entire length of the magnet assembly, formed at angle α as discussed above.

In one alternative embodiment, the plurality of openings 141 can be formed at different angles relative to the backing tube 102 and each other to provide cross flow streams of coolant. In another alternative embodiment, as shown in FIG. 2E, the plurality of openings 141 may comprise openings having a larger diameter (e.g., aperture openings 160C) adjacent to ends of the magnet assembly than adjacent to a middle portion of the magnet assembly (e.g., aperture openings 160A) to provide more coolant at the top and bottom of the assembly where the top and bottom portions of the racetrack 300 extend. As also shown in FIG. 2E, the plurality of first openings 141 may be formed so as to be distributed non-uniformly along a length of the magnet assembly, such that there are more openings per unit length adjacent to ends of the magnet assembly (e.g., aperture openings 160C and 160B) than adjacent to a middle portion of the magnet assembly (e.g., aperture openings 160A) to provide more coolant at the top and bottom of the assembly where top and bottom portions of the racetrack 300 extend. The non-uniform size and distribution of openings may be used in combination (e.g., larger and more dense openings near the ends). Alternatively, the plurality of first openings may also comprise first openings of uniform diameters and/or the plurality of first openings are formed so as to be distributed uniformly along a length of the magnet assembly.

In addition to a plurality of first openings, the conduit may also comprise a plurality of second openings formed at such angles for providing coolant so as to pre-cool portions of the backing tube not yet adjacent to the magnets of the magnet assembly during target rotation and/or formed at such angles for providing coolant so as to post-cool portions of the backing tube recently adjacent to the magnets of the magnet assembly during target rotation.

Referring to another embodiment of the invention shown in FIG. 3, a sputtering target assembly 200 may comprise at least one wiper fin 126 disposed within the backing tube 102. The wiper fin can be adapted to contact the inner surface 18 of the backing tube while the backing tube rotates (indicated by larger arrow marked by the phrasing "Rotation Direction") past the at least one wiper fin 126 to agitate a coolant boundary layer located along the inner surface of the backing tube. Arrows 40 and 42 indicate agitation of the coolant. The at least one wiper fin may be flexible and comprise a plastic or rubber material. The magnet assembly 12 may further include one separator fin 126' to prevent coolant in the interior backing tube volume 30 from re-entering the gap volume 20. In this embodiment, providing coolant flow in a circumferential direction is optional.

Figure 4:
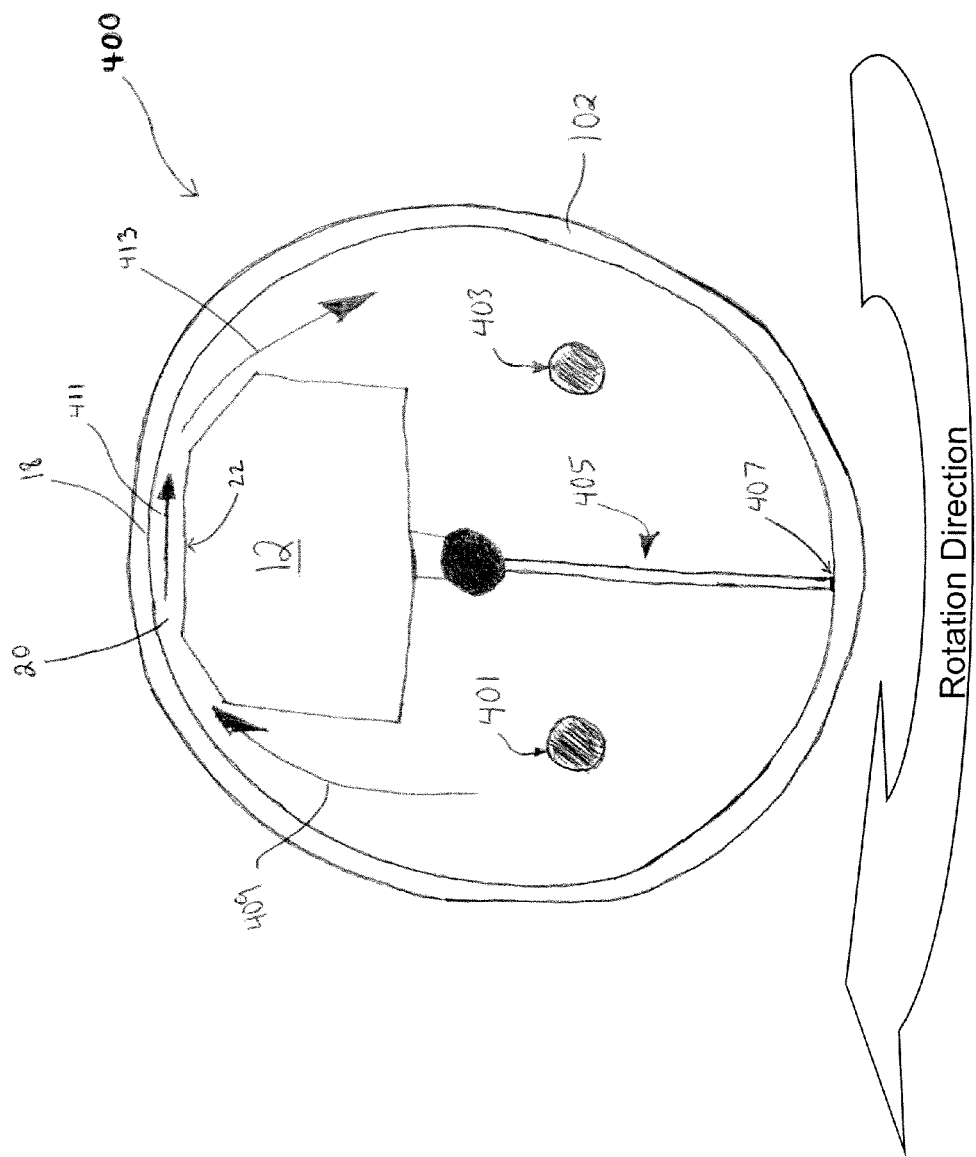
FIG. 4 is a top cross-sectional view of the sputtering target assembly of another embodiment.

In another embodiment of the invention shown in FIG. 4, a sputtering target assembly 400 may comprise at least an inlet 401 in an inlet section separated from an outlet 403 in an outlet section. Inlet 401 may be separated from outlet 403 by a rigid or flexible separator 405 and the magnet assembly 12. For example, the separator 405 may extend from the magnet assembly 12 to the inner surface 18 of the backing tube to form a barrier that separates coolant from the inlet 401 and coolant which has flowed through the gap volume to the outlet 403. By providing the separator 405 to eliminate or minimize fluidic connection between inlet 401 and outlet 403, the only substantial fluidic connection between the inlet and the outlet is the gap volume 20 between a front side 22 of the magnet assembly and the inner surface 18 of the backing tube. Additionally, the separator 405 may cause coolant to have a higher pressure on an inlet 401 side of the separator 405 inside the backing tube relative to a lower pressure on an outlet 403 side of the separator 405 inside the backing tube. Thus, the coolant flows from inlet 401 in a substantially circumferential direction toward an inner surface of the backing tube and into gap volume 20, and subsequently to outlet 403 due to the pressure difference.

The separator end 407 may be adapted to contact the inner surface 18 of the backing tube 102 while the backing tube rotates (indicated by the larger arrow marked by the phrasing "Rotation Direction" in FIG. 4). The separator end 407 may contain a sealing element, such as a rubber stopper, gasket, seal, roller or the like, pressed against inner surface 18 while the backing tube rotates so as to cause substantially all of the coolant introduced at the inlet 401 to flow substantially circumferentially as described above. In other words, separator end 407 of separator 405 contacts inner surface 18 to minimize or completely eliminate fluidic connection between inlet 401 and outlet 403 at end 407. Thus, the term "substantial fluidic connection between the inlet and the outlet is the gap volume" includes no leakage between the separator and the inner surface of the backing tube and unintentional leakage between the separator and the inner surface of the backing tube.

While some leakage between the separator end 407 and inner surface 18 of the backing tube may be expected, most of the fluid flow occurs through the volume gap 20 as described above. Arrows 409, 411 and 413 indicate a substantially circumferential coolant flow through the gap volume 20 providing the only substantial fluidic connection between inlet 401 and outlet 403.

In one embodiment the fluid inlet 401 is a hole or opening from the fluid conduit (e.g., water pipe) in one end of the backing tube, and the fluid outlet 403 may be a hole or opening to a drain in the same or opposite end of the backing tube. For example, for a vertically positioned target, the inlet 401 may be in the bottom end while the outlet 403 may be in the top end. In another embodiment, a fluid distribution member (not shown), for example a manifold with one or more openings along its length, may extend from a first end of the backing tube toward a second end, for example an opposite end, and may be fluidly connected to a coolant source (not shown) so as to form a coolant inlet 401. Thus, the fluid distribution member can be fluidly connected to an external coolant source, such as a water coolant source (e.g., water pipe) and may provide coolant in a substantially circumferential direction toward an inner surface of the backing tube and into gap volume 20 between a front side 22 of the magnet assembly 12 and the inner surface 18 of the backing tube 102. For example, the fluid distribution member may be provided with openings similar to the openings 141 described in FIGS. 2A-2E. The outlet 403 may be separated from the distribution member by separator 405 leaving volume gap 20 as the only substantial fluidic connection between the fluid distribution member and the out. The outlet may be adapted to allow the water coolant to exit from within the backing tube and target assembly.

Figure 5B:
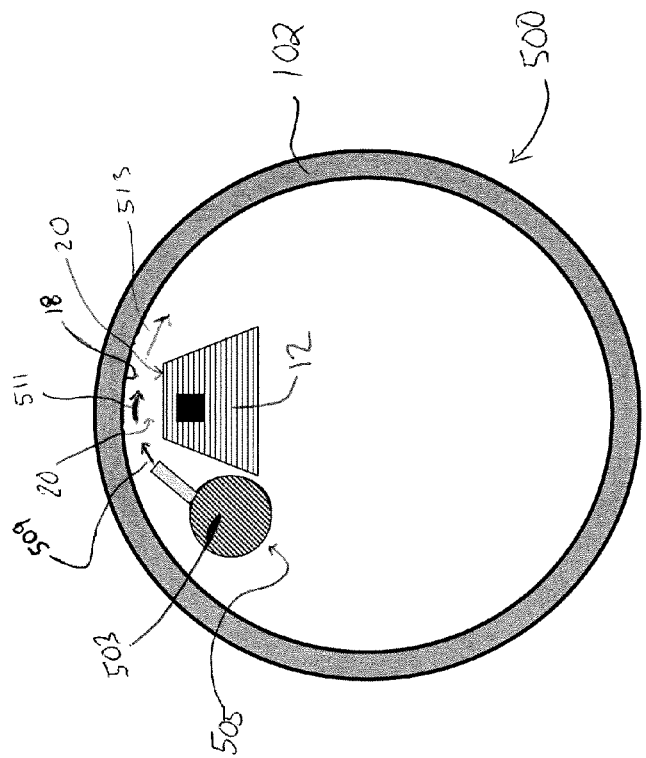
FIG. 5B is a top cross-sectional view of the sputtering target assembly of FIG. 5A.
Figure 5A:
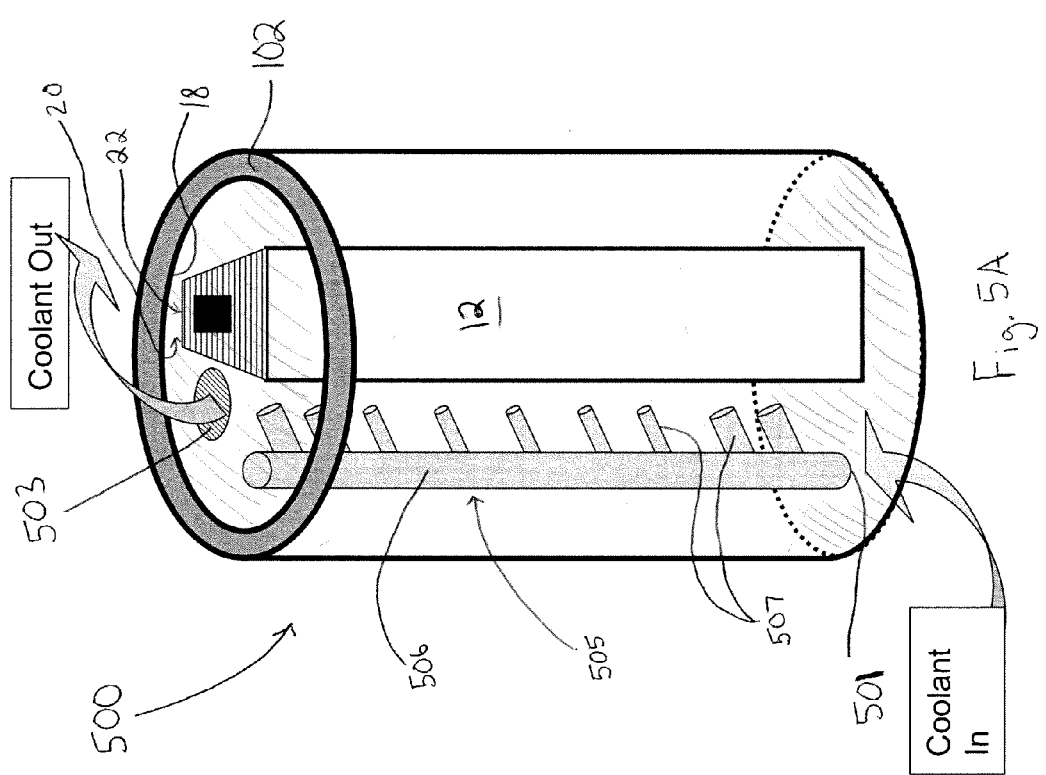
FIG. 5A is a perspective view of another embodiment of the sputtering target assembly of another embodiment.

In another embodiment of the invention shown in FIGS. 5A-5B, a sputtering target assembly 500 comprises a fluid distribution member 505 separate from a magnet assembly 12. The fluid distribution member 505 may extend from a first end of the backing tube toward a second end, for example an opposite end, and may be fluidly connected to a coolant source (not shown) so as to form a coolant inlet 501. Thus, the fluid distribution member 505 can be fluidly connected to an external coolant source, such as a water coolant source (e.g., water pipe) and may provide coolant in a substantially circumferential direction toward an inner surface of the backing tube and into gap volume 20 between a front side 22 of the magnet assembly 12 and the inner surface 18 of the backing tube 102. The fluid distribution member 505 can comprise a main conduit section 506 in fluidic connection with one or more nozzles 507 to direct coolant in a substantially circumferential direction as described above. Main conduit section 506 may be a tube or pipe. Nozzles 507 may also be tubes or pipes and can be directionally configured, oriented and/or distributed along a length of main conduit section 506 similar to openings 141 with respect to FIGS. 1C and 2E, except in the embodiment shown in FIGS. 5A-5B, the main conduit section 506 is separate from the magnet assembly 12.

For example, nozzles 507 may be provided with larger diameters and/or in closer proximity to adjacent ones toward end portions of the fluid distribution member than nozzles 507 at center portions. Additionally, nozzles 507 may be oriented in several directions such as in a direction perpendicular to the longitudinal axis of the backing tube, or at various angles up or down so long as the nozzles are adapted for providing coolant in a substantially circumferential direction indicated by arrows 509, 511 and 513 toward inner surface 18 and through the gap volume 20. Outlet 503 may be located on an opposing end of the backing tube from inlet 501, and may be concentric or non-concentric with fluid distribution member 505. In one embodiment, fluid outlet 503 may be a hole or opening to a drain in the same or opposite end of the backing tube as fluid inlet 501.

In operation, a method for cooling a sputtering target assembly is provided. The method may be defined by the steps of: i) providing a sputtering target assembly such as an embodiment of the sputtering target described above, for example the sputtering target of FIG. 1A, and ii) flowing a coolant from the conduit in a substantially circumferential direction toward an inner surface of the backing tube and into a gap volume between a front side of the magnet assembly and the inner surface of the backing tube. The coolant may be provided in a flow direction substantially the same as the direction of target rotation, or may be provided counter to the direction of rotation so long as coolant is provided from the conduit in a substantially circumferential direction toward an inner surface of the backing tube and into a gap volume.

In one embodiment of the method, the step of flowing a coolant from the conduit in a substantially circumferential direction toward an inner surface of the backing tube as discussed above can include flowing the coolant through the coolant plenum 145 from the inlet located at the first end (e.g., the bottom end) of the backing tube, flowing the coolant from the coolant plenum into the coolant channel 143, and flowing the coolant from the coolant channel 143 into the gap volume 20 via opening(s) 141.

The method for cooling a sputtering target may further include the steps of: iii) flowing the coolant from the gap volume 20 into an interior backing tube volume 30, and iv) flowing the coolant from the interior backing tube volume out through an outlet located at a second end (e.g., a top end) of the backing tube opposite to the first end.

In some embodiments, the coolant comprises water and the water is provided toward the inner surface of the backing tube and into the gap volume at angle of a where a may be 45° or less with respect to a line tangential to the inner surface of the backing tube enclosing the gap volume as described for the embodiment of FIG. 1C above. In other embodiments, the coolant comprises water and the water is provided into the gap volume through multiple openings formed along a length of the magnet assembly and/or through one slit that extends substantially an entire length of the magnet assembly as described for the embodiment in FIGS. 2A-2E above.

Furthermore, the coolant flows into the gap volume through a plurality of openings 141 formed in the conduit in FIG. 1A. In some embodiments, a velocity profile of coolant provided from a plurality of openings along the front side of the magnet assembly is substantially constant. In some embodiments, a velocity profile of coolant from each of the plurality of openings along a front side of the magnet assembly varies.

In one embodiment of the method for cooling a sputtering target assembly, the coolant is provided out of the openings 141 and/or into the gap volume in turbulent flow such that a Reynolds number of the coolant provided from openings 141 and/or into the gap volume 20 is at least 3000, such as 3000-5000. The coolant flow rate is dependent on several factors, such as the backing tube material which may comprise stainless steel, brass, copper, titanium, etc., the cathode length which may be e.g., 0.5-5 m, such as 1.5-3.5 m, sputtering power which may be e.g., 10-50 kW such as 25-40 kW, and/or other factors. In one embodiment, the coolant preferably comprises water provided at a flow rate of at least 5 gal/min Other coolants, such as propylene glycol, ethylene glycol, and ammonia may be used instead of or in addition to water. The coolants may be provided as a liquid or a gas.

By providing coolant having a Reynolds of at least 3000, the resulting turbulent flow provides increased mixing and dissipation of heated coolant which already contacted the backing tube, especially coolant at a boundary layer between lower temperature coolant and the inner surface 18 of the backing tube.

Additionally, coolant flow conductance at the at least one opening 141 is preferably less than the conductance of coolant flow through the plenum 45 by a factor of 10 or more, such as 10-20, to provide equal water flow through each of first opening 141.

Furthermore, because target material at ends of the target may have increased residence times adjacent to top and bottom magnet racetrack 300 portions during target rotation, increased heat exchange may be required at the ends of the backing tube. Thus, various configurations of first openings may be adapted.

For example, in one embodiment described above with respect to FIG. 2E, the plurality of openings 141 have a larger diameter adjacent to ends of the magnet assembly than adjacent to a middle portion of the magnet assembly. Thus, in operation, the coolant that is provided from the conduit toward the inner surface of the backing tube 18 and into the gap volume 20 flows at a higher volumetric flow rate adjacent to ends of the magnet assembly than adjacent to a middle portion of the magnet assembly.

In another embodiment described above with respect to FIG. 2E, the plurality of openings 141 may also comprise more openings formed at the ends of the magnet assembly than at the middle, and/or larger openings at the ends than at the middle.

In another embodiment described above for a sputtering target assembly, the plurality of openings may also comprise openings 141 with uniform diameters and/or distributed uniformly along a length of the magnet assembly. Thus, in operation, the coolant that is provided from the conduit toward the inner surface of the backing tube and into the gap volume flows at the same volume adjacent to ends of the magnet assembly as adjacent to a middle portion of the magnet assembly.

In another embodiment described above for the sputtering target assembly, the plurality of first openings can be formed at different angles in an axial direction, for example at angles other than 90° with respect to axis 24 in FIG. 1B, in directions towards the ends of assembly 12. Thus, in operation, the coolant that is provided from the conduit toward the inner surface of the backing tube and into the gap volume may be provided as a plurality of cross streams.

The sputtering target may be used to sputter any sputtering material 104 onto a substrate. For example, a method of using the sputtering target may further comprise the steps of rotating the backing tube while the magnet assembly remains static, sputtering a copper indium gallium material 104 from an outer surface of the backing tube 102, and providing a selenium containing gas into the sputtering chamber to form a copper indium gallium selenide layer of a solar cell on a substrate (as described in U.S. Pat. No. 7,544,884).

Another embodiment of the method of cooling a sputtering target may further comprise the steps of agitating a coolant boundary layer located along the inner surface of the backing tube by contacting at least one wiper fin 126 to the inner surface of the rotating backing tube 102 as shown in FIG. 3. The at least one wiper fin 126 may be static while the backing tube rotates. Fin 126 prevents coolant exiting gap volume 20 into tube volume 30 from returning into the gap volume.

In another embodiment shown in FIG. 4, the method of cooling a sputtering target may include introducing the coolant through an inlet 401, flowing the coolant in a substantially circumferential direction through the gap volume 20 toward an inner surface 18 of the backing tube 102, and allowing the fluid to exit at an outlet 403. In this embodiment, the inlet and outlet may be separated by separator 405 leaving volume gap 20 as the only substantial fluidic connection between the inlet and the outlet.

EXAMPLES

Figure 6B:
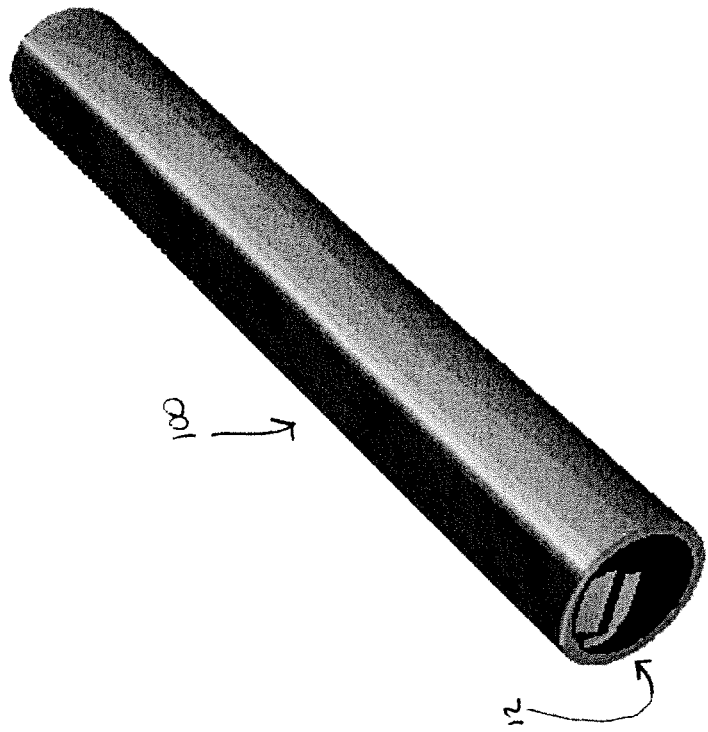
FIG. 6B shows the temperature profile simulation across a model sputtering target assembly of one of the embodiments of the invention during operation.
Figure 6A:
FIG. 6A shows a temperature profile simulation across a model sputtering target assembly utilizing standard cooling during operation.

Several targets were modeled under normal sputtering conditions to gain information regarding temperature profiles. Targets comprising standard cooling (i.e., where water is provided into the gap volume 20 axially along axis 24 shown in FIG. 1B) were modeled for temperature variations as visualized in FIG. 6A. Targets comprising configurations and methods of the current embodiments were modeled for temperature variations as visualized in FIG. 6B.

Targets comprising standard cooling of comparative examples (CE1 and CE2), and exemplary sputtering targets as described in the embodiments above (Ex 1 and Ex 2) were modeled. In Table 1, the resulting peak temperatures at an inner diameter of the backing tubes ("BT-ID") and at an exterior surface of the target material ("Target") for each of a first end ("End 1") and a second end ("End 2") of the modeled vertical sputtering targets are shown. Results were modeled at various rotation rates of the targets.

TABLE 1

|  | Peak Temp | | | |
| --- | --- | --- | --- | --- |
|  | End 1 | | End 2 | |
| Case | BT - ID | Target | BT - ID | Target |
| CE1 | 35.8 | 84.6 | 168.4 | 205.0 |
| CE2 | 27.0 | 64.6 | 139.1 | 173.3 |
| Ex 1 | 54.6 | 107.9 | 67.1 | 111.9 |
| Ex 2 | 51.3 | 88.5 | 57.2 | 93.2 |

As shown in Table 1, the temperatures between the first and second ends as measured at both the inner diameter of the backing tube, and the target surface vary greatly for the standard targets CE1 and CE2. This indicates that standard cooling results in uneven cooling. On the other hand, the temperatures for Ex1 and Ex2 provide a more uniform temperature profile.

In table 2 below, maximum temperatures are reported. The temperature difference ("Delta T") in a circumferential ("Circum") direction relative to the point of maximum temperature, and the temperature difference as measured in an axial direction ("Axial") over the magnet assembly are also shown.

TABLE 2

|  | T max | Delta T | |
| --- | --- | --- | --- |
| Case | (° C.) | Circum | Axial |
| CE1 | 205.0 | 60.3 | 120.4 |
| CE2 | 173.3 | 33.7 | 108.7 |
| Ex 1 | 111.9 | 54.9 | 4.0 |
| Ex 2 | 93.2 | 34.0 | 4.7 |

As shown in Table 2, the CE1-CE2 targets comprising standard cooling reach higher maximum temperatures compared with Ex1 and Ex2. Thus, the sputtering material of standard cooling targets and methods may be susceptible to damage due to the high temperatures that may occur during operation. The data also show that the CE1-CE2 targets experience large temperature differences an axial direction along the magnet racetrack where the maximum temperatures typically occur (as confirmed in Table 1). Additionally, the data show that the circumferential temperature difference for CE1-CE2 targets are generally lower than for the same measurement for Ex1 and Ex2. However, it is noted that this axial temperature difference is relative to the maximum temperature value for that target. Thus, the minimum temperatures in a circumferential direction relative to the point of maximum temperature for CE1-CE2 is still higher than the minimum temperature measured similarly for Ex1 and Ex2. This indicates that the standard cooling of CE1-CE2 is not as efficient in a circumferential direction as compared to the cooling for Ex1 and Ex2. Thus targets Ex1 and Ex2 are not only able to produce lower maximum temperatures, but are also able to maintain a lower overall temperature of the sputtering target material.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the coolant to be provided in a substantially circumferential direction from the conduit toward an inner surface of the backing tube into a gap volume between a front side of the magnet assembly and the inner surface of the backing tube.

What is claimed is:

1. A sputtering target assembly, comprising:
   a cylindrical backing tube;
   a magnet assembly disposed within the backing tube, such that a gap volume is formed between the magnet assembly and an inner surface of the backing tube; and
   a conduit disposed within the backing tube and configured to provide coolant directly into the gap volume, at an angle α of 45° or less, the conduit comprising:
      a coolant plenum disposed within the backing tube adjacent to a back portion of the magnet assembly; and
      a coolant channel fluidly connected to the coolant plenum and located adjacent to the side portion of the magnet assembly, wherein:
   the angle α is taken with respect to a first line along which coolant initially flows out of the conduit, and a second line tangential to the backing tube at a point where the first line intersects the inner surface of the backing tube;
   substantially all of the coolant in the gap volume flows in a single circumferential direction that is substantially perpendicular to a longitudinal axis of the cylindrical backing tube;
   the coolant plenum, the coolant channel and the gap volume form a coolant circuit; and
   the sputtering target assembly lacks a wiper fin, rubber stopper, gasket, seal or roller which contacts an inner surface of the backing tube.

2. The sputtering target assembly of claim 1, wherein:
   the magnet assembly extends substantially parallel to the longitudinal axis of the cylindrical backing tube;
   the magnet assembly comprises a first end, a second end, and a side portion extending between the first and second end;
   the coolant plenum is adapted to stiffen the magnet assembly;
   the coolant plenum contains an inlet located at a first end of the backing tube and connected to a water coolant source; and
   an outlet located is at a second end of the backing tube opposite to the first end and adapted to allow the water coolant to exit from within the backing tube.

3. The sputtering target assembly of claim 2, wherein the angle α is between 5 and 35°.

4. The sputtering target assembly of claim 2, wherein the coolant plenum comprises at least one baffle or partition adapted to direct flow of coolant in the single circumferential direction.

5. The sputtering target assembly of claim 2, wherein the coolant channel is embedded in a side portion of cover plate of the magnet assembly.

6. The sputtering target assembly of claim 1, wherein at least one of a cover plate comprising the front side of the magnet assembly or the inner surface of the backing tube are roughened to induce turbulent flow of the coolant.

7. The sputtering target assembly of claim 1, wherein the conduit comprises at least one nozzle directed at the inner surface of the backing tube.

8. The sputtering target assembly of claim 1, wherein the conduit comprises a single slit that extends substantially parallel to the longitudinal axis of the cylindrical backing tube, the slit having a length that is substantially equal the length of the magnet assembly.

9. The sputtering target assembly of claim 2, wherein the conduit comprises a plurality of the coolant channels, which are spaced apart along the length of the magnet assembly.

10. The sputtering target assembly of claim 9, wherein at least some of the coolant channels are formed at different angles in an axial direction relative to the backing tube to provide cross flow streams of coolant.

11. The sputtering target assembly of claim 9, wherein the coolant channels disposed adjacent to ends of the magnet assembly have a larger diameter than the coolant channels disposed adjacent to a middle portion of the magnet assembly.

12. The sputtering target assembly of claim 9, wherein the coolant channels have substantially the same diameter and are distributed uniformly along the length of the magnet assembly.

13. The sputtering target assembly of claim 9, wherein the coolant channels are non-uniformly distributed along the length of the magnet assembly, such that there are more coolant channels per unit length adjacent to ends of the magnet assembly than adjacent to a middle portion of the magnet assembly.

14. The sputtering target of claim 1, further comprising a copper indium gallium sputtering material located on an outer surface of the backing tube.

15. The sputtering target assembly of claim 1, wherein the conduit comprises a coolant inlet located in an inlet section of the backing tube which is separated from an outlet by a separator such that only the gap volume provides a substantial fluidic connection between the coolant inlet and the outlet.

* * * * *